United States Patent
Kurata

(10) Patent No.: US 6,800,536 B2
(45) Date of Patent: Oct. 5, 2004

(54) SEMICONDUCTOR DEVICE HAVING AN INSULATED GATE AND A FABRICATION PROCESS THEREOF

(75) Inventor: Hajime Kurata, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 38 days.

(21) Appl. No.: 10/442,224

(22) Filed: May 21, 2003

(65) Prior Publication Data

US 2003/0201505 A1 Oct. 30, 2003

Related U.S. Application Data

(62) Division of application No. 09/818,651, filed on Mar. 28, 2001, now Pat. No. 6,624,483.

(30) Foreign Application Priority Data

Jul. 12, 2000 (JP) ........................................ 2000-210793

(51) Int. Cl.[7] .................... H01L 21/20; H01L 21/336
(52) U.S. Cl. .................... 438/387; 438/307; 438/308
(58) Field of Search ................. 438/387, 307, 438/305, 475, 285, 268, 257

(56) References Cited

U.S. PATENT DOCUMENTS

| | | | | |
|---|---|---|---|---|
| 5,258,095 A | * | 11/1993 | Nagata et al. | 438/257 |
| 5,471,080 A | * | 11/1995 | Satoh et al. | 257/344 |
| 5,567,642 A | | 10/1996 | Kim et al. | |
| 5,650,342 A | * | 7/1997 | Satoh et al. | 438/305 |
| 5,723,893 A | | 3/1998 | Yu et al. | |
| 5,834,817 A | * | 11/1998 | Satoh et al. | 257/387 |
| 5,877,535 A | | 3/1999 | Matsumoto | |
| 6,002,150 A | * | 12/1999 | Gardner et al. | 257/310 |
| 6,118,151 A | * | 9/2000 | Tsutsu | 257/347 |
| 6,190,975 B1 | * | 2/2001 | Kubo et al. | 438/285 |
| 6,284,613 B1 | * | 9/2001 | Subrahmanyam et al. | 438/307 |
| 6,326,667 B1 | * | 12/2001 | Sugiyama et al. | 257/347 |
| 6,633,072 B2 | * | 10/2003 | Yamazaki et al. | 438/475 |

FOREIGN PATENT DOCUMENTS

JP 11-135792 5/1999

* cited by examiner

Primary Examiner—John F. Niebling
Assistant Examiner—Walter L. Lindsay, Jr.
(74) Attorney, Agent, or Firm—Westerman, Hattori, Daniels & Adrian, LLP

(57) ABSTRACT

A semiconductor device includes a T-shaped gate on a gate insulation film, wherein the T-shaped gate includes a lower polycrystal layer containing Si and Ge and an upper polycrystal layer of polysilicon.

4 Claims, 6 Drawing Sheets

SEMICONDUCTOR DEVICE HAVING AN INSULATED GATE AND A FABRICATION PROCESS THEREOF

This application is a division of prior application Ser. No. 09/818,651 filed Mar. 28, 2001 now U.S. Pat. No. 6,624,483.

CROSS-REFERENCE TO RELATED APPLICATION

The present application is based on Japanese priority application No.2000-210793 filed on Jul. 12, 2001, the entire contents of which are hereby incorporated by reference.

BACKGROUND OF THE INVENTION

The present invention generally relates to semiconductor devices and more particularly to a semiconductor device having an insulated gate electrode and a fabrication process thereof.

With the progress in the art of device miniaturization, semiconductor devices forming an advanced high-speed LSIs or advanced memory LSIs are now having a gate length approaching the value of 0.1 μm.

In such highly miniaturized, high-speed semiconductor devices, there emerges a problem of signal delay caused by a parasitic capacitance that is formed at the part of the semiconductor device in which a diffusion region formed adjacent to a gate electrode invades into the region right underneath the gate electrode in the form of extension of the diffusion region.

In order to minimize such an overlap of the extension region, there is proposed a MOSFET that uses a T-shaped gate electrode.

FIG. 1 shows the construction of a conventional MOSFET having such a T-shaped gate.

Referring to FIG. 1, the MOSFET is constructed on a p-type Si substrate 41 and includes a T-shaped gate electrode 43 provided on the Si substrate 41 with a gate oxide film 42 interposed between the Si substrate 41 and the gate electrode 43.

At both lateral sides of the T-shaped gate electrode, there are formed n-type extension regions 44 formed by an ion implantation process of an impurity element such as As, wherein the ion implantation process for forming the extension regions 44 is conducted while using the top part of the T-shaped gate electrode 43 as a mask.

After formation of the n-type extension regions 44, sidewall insulation films (not shown) are provided on both lateral sidewalls of the gate electrode 43, and $n^+$-type diffusion regions 45 are formed in the substrate 41 in the region outside the sidewall insulation films by an ion implantation process of an impurity element such as As while using the sidewall insulation films as a mask.

According to the foregoing process, the extension regions 44 are formed initially with an offset from the bottom lateral edge of the gate electrode, due to the fact that the ion implantation for forming the extension regions 44 has been conducted while using the top part of the T-shaped gate electrode 43 as a mask. This offset, however, disappears as the thermal annealing process for activating the introduced As ions is conducted, and the extension part 44 has a tip end generally coincident to the bottom lateral edge of the T-shaped gate electrode 43 in the state of FIG. 1 in which the thermal annealing process has been conducted.

On the other hand, the structure of FIG. 1 has a drawback, due to the use of the T-shaped gate electrode, in that the control of the process is difficult. Particularly, it has been necessary to use a complex process for forming the T-shaped gate electrode.

More specifically, it has been necessary to apply a lateral etching process to a gate electrode patterned according to an ordinary process, with such a condition that the lateral etching process acts preferentially upon the bottom part of the gate electrode with respect to the gate insulation film. However, control of such a lateral etching process is difficult.

Further, there arises a problem in the MOSFET of FIG. 1 in that B introduced into the gate electrode 43 may invade into the channel region of the MOSFET across the gate insulation film 42 at the time of thermal annealing process for activating the impurity elements introduced by the ion implantation process. When such invasion of B occurs in the channel region, the threshold characteristic of the MOSFET is inevitably modified.

One way to avoid this modification of the threshold characteristic of MOSFET would be to reduce the temperature used for the thermal activation process of the impurity element. However, the use of such a low thermal activation temperature results in insufficient activation of the doped impurity elements, and there can occur the formation of depletion region in the gate region adjacent to the gate insulation film as a result of the insufficient activation of the impurity elements.

SUMMARY OF THE INVENTION

Accordingly, it is a general object of the present invention to provide a novel and useful semiconductor device having an insulated gate and fabrication process thereof wherein the foregoing problems are eliminated.

Another and more specific object of the present invention is to provide a semiconductor device having a T-shaped insulated gate wherein the problem of penetration of B across a gate insulation film is eliminated.

Another object of the present invention is to provide a simple and reliable process for fabricating a semiconductor device having a T-shaped insulated gate.

Another object of the present invention is to provide a semiconductor device, comprising:

a substrate including a semiconductor layer at least on a top part thereof;

a gate insulation film provided on said semiconductor layer; and a gate electrode provided on said gate insulation film, said gate electrode comprising a first polycrystal layer in contact with said gate insulation film, said first polycrystal layer containing at least Si and Ge, and a second polycrystal layer provided on said first polycrystal layer, said first polycrystal layer having a reduced lateral size as compared with said second polycrystal layer, said first and second polycrystal layers thereby forming a T-shaped gate electrode.

Another object of the present invention is to provide a method of fabricating a semiconductor device, comprising the steps of:

forming a gate insulation film on a substrate, said substrate including a semiconductor layer at least on a top part thereof;

depositing a first polycrystal layer containing at least Si and Ge on said semiconductor layer;

depositing a second polycrystal layer of Si on said first polycrystal layer;

patterning said first and second polycrystal layers to form a gate electrode defined by a pair of sidewalls; and applying an oxidation process to said first and second polycrystal layers such that said first and second polycrystal layers undergo oxidation at said both sidewalls.

According to the present invention, the penetration of B into the channel region of the semiconductor device through the gate insulation film is effectively blocked by interposing the SiGe first polycrystal layer between the gate insulation film and the second polycrystal layer. As a result, the semiconductor device provides a stable threshold characteristic. As a result of the use of the T-shaped gate electrode, the problem of penetration of the extension region of the diffusion region into the channel region right underneath the gate electrode is positively eliminated, and the semiconductor device of the present invention provides a high operational speed.

Further, the use of the SiGe first polycrystal layer facilitates formation of the T-shaped electrode due to the accelerated oxidation rate as compared with an ordinary polysilicon layer. More specifically, the desired T-shaped gate electrode is formed easily in a single oxidation step.

Other objects and further features of the present invention will become apparent from the following detailed description when read in conjunction with the attached drawings.

DETAILED DESCRIPTION OF THE INVENTION

[Principle]

Figure 1:
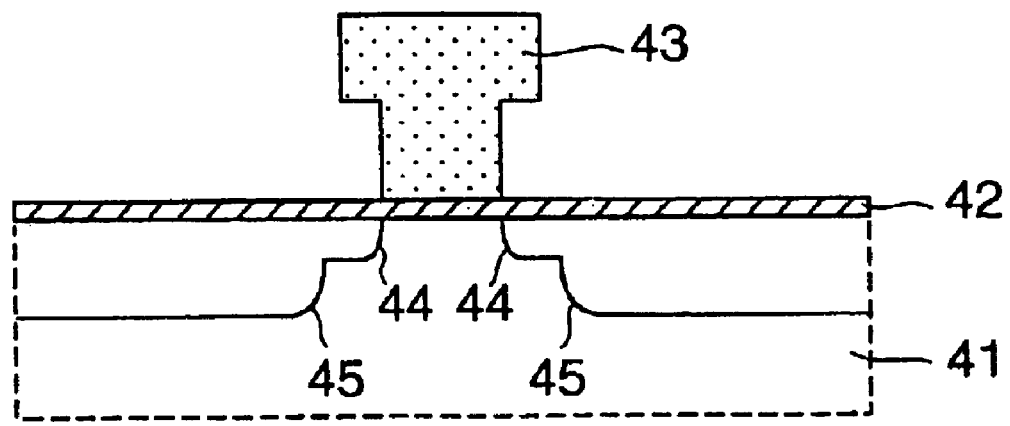
FIG. 1 is a diagram showing the construction of a MOSFET according to a related art.
Figure 2:
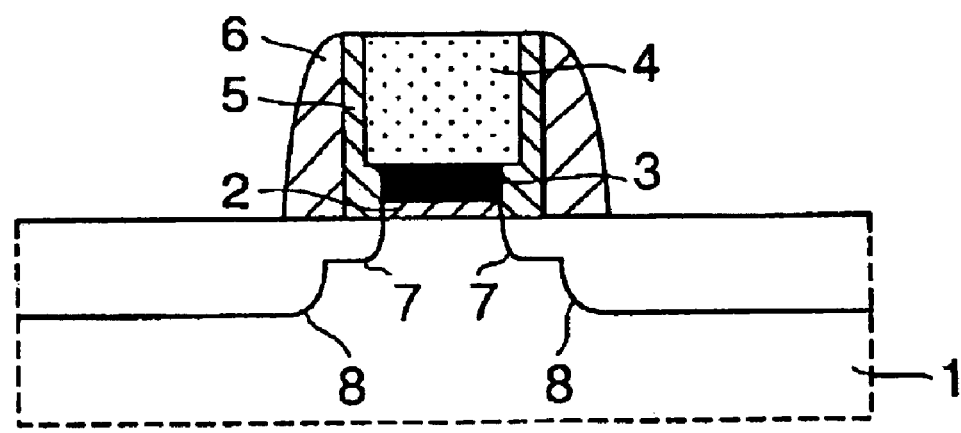
FIG. 2 is a diagram showing the construction of a MOSFET showing the principle of the present invention.

FIG. 2 shows the principle of the present invention.

Referring to FIG. 2 showing a MOSFET of the present invention, the MOSFET is constructed on semiconductor substrate 1 formed therein a pair of diffusion regions 8 having respective extension regions 7, wherein the extension regions 7 define therebetween a channel region.

On the substrate 1, there is provided a gate insulation film 2 in correspondence to the channel region and a polycrystal layer 3 of SiGe is provided on the gate insulation film 2 in contact therewith. Further, a polysilicon layer 4 is provided on the polycrystal layer 3 with an increased lateral width, wherein the polysilicon layer 4 form, together with the polycrystal layer 3, a T-shaped gate electrode.

It should be noted that the T-shaped gate electrode is actually formed by a lateral oxidation process applied to the polycrystal layer 3 and further to the polysilicon layer 4, wherein such an oxidation process proceeds with a greater rate in the polycrystal layer 3 that contains Ge in addition to Si as compared with the polysilicon layer 4. As a result, the T-shape gate electrode carries a lateral oxide film 5 on both lateral sides thereof such that the lateral oxide film 5 has an increased thickness in the part thereof covering the sidewall of the polycrystal layer 3 as compared with the part covering the sidewall of the polysilicon layer 4.

In the structure of FIG. 2, the extension region 7 is formed by introducing an impurity element by an ion implantation process while using the lateral oxide film 5 as a mask. Further, the diffusion regions 8 are formed in the substrate 8 by an ion implantation process while using sidewall insulation films 6 provided on the lateral oxide film 5 as a mask.

As a result of the use of the SiGe polycrystal layer 3 between the polysilicon layer 4 and the gate insulation film 2, the problem of penetration of B contained in the polysilicon layer 4 into the channel region across the gate insulation film 2 is effectively eliminated, and the MOSFET of FIG. 2 shows a stabilized threshold characteristic.

Further, the MOSFET of FIG. 2 shows an advantageous feature of reduced parasitic capacitance for the extension regions 7 due to the use of the T-shaped gate electrode structure. By providing the SiGe polycrystal layer 3 underneath the polysilicon layer 4 and by utilizing the difference of oxidation rate between the polycrystal layer 3 and the polysilicon layer 4, it is possible to form the desired T-shaped gate structure by a mere single oxidation step. Associated with the use of the T-shaped gate electrode, the MOSFET of FIG. 2 is advantageous for providing a silicide layer on the top part of the polysilicon layer 4.

It should be noted that the polycrystal layer 3 may contain C in addition to Si and Ge. In this case, the polycrystal layer 3 is formed of a SiGeC mixed crystal. The use of the SiGeC mixed crystal further enhances effect of blocking the penetration of B. Further, the polycrystal layer 3 may contain additional impurity elements such as B, P or As.

In the MOSFET of FIG. 2, it is also possible to remove the lateral oxide film 5 after the formation of the T-shaped gate electrode but before the formation of the sidewall insulation films 6. By removing the lateral oxide film 5, it is possible to control the formation of a punch-through stopper at the channel region with high accuracy. It should be noted that such a punch-through stopper is formed by an ion implantation of B or As through the bottom notched region of the T-shaped gate electrode.

[First Embodiment]

Hereinafter, a fabrication process of a MOSFET according to a first embodiment of the present invention will be described with reference to FIGS. 3A–3F.

Figure 3A:
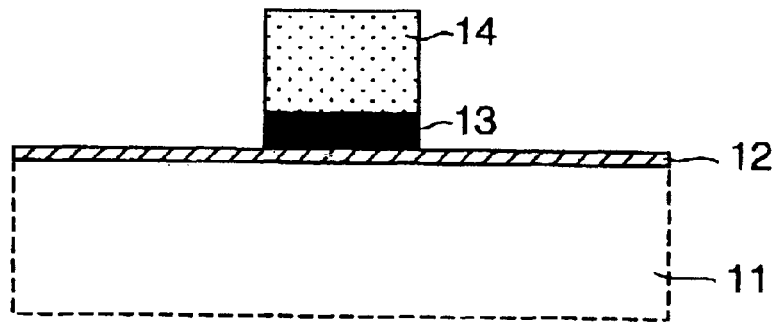
FIGS. 3A–3F are diagrams showing the fabrication process of a MOSFET according to a first embodiment of the present invention.

Referring to FIG. 3A, a gate oxide film 12 is formed on a p-type Si substrate 11 with a thickness of 3 nm, and a polycrystal SiGe layer 13 is formed on the gate oxide film 12 with a thickness of 10–150 nm, preferably about 50 nm, by a low-pressure CVD process, while using $SiH_4$ and $GeH_4$ as the source of Si and Ge. Further, a polysilicon layer 14 is deposited on the polycrystal SiGe layer 13 with a thickness of 20–200 nm, preferably about 100 nm, by a CVD process while using $SiH_4$ as the source of Si. The SiGe polycrystal layer 13 may have a composition in the range of $Si_{90}Ge_{10}$–$Si_{10}Ge_{90}$. In a preferred example, the SiGe polycrystal layer 13 may have a composition of $Si_{90}Ge_{10}$.

Next, an anisotropic etching process is applied to the layers 13 and 14 thus formed such that there is formed a gate electrode structure having a gate length of 0.1 $\mu$m.

Figure 3B:
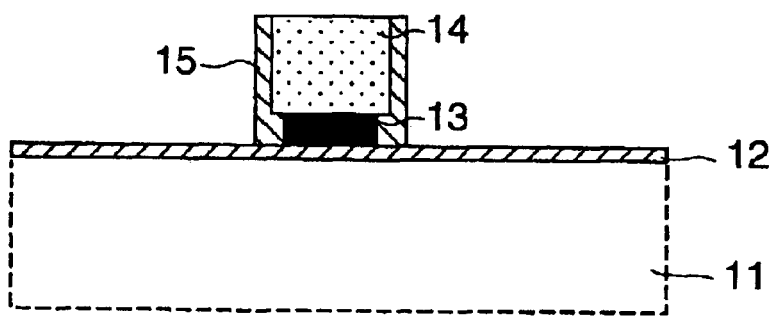

Next, in the step of FIG. 3B, the structure of FIG. 3A is subjected to a dry oxidation process conducted in an oxidizing atmosphere at 800° C. for 3 minutes, and there are formed oxide films 15 on both lateral sidewalls of the gate electrode structure of FIG. 3A as represented in FIG. 3B. While not illustrated, it should be noted that the top surface of the polysilicon layer 14 is protected from oxidation by an SiN mask not illustrated.

During the oxidation process of FIG. 3B, it should be noted that the oxidation rate of the SiGe polycrystal layer 13 is much larger than the oxidation rate of the polysilicon layer 14 by twice or three times. Thus, the oxidation process proceeds much faster in the SiGe polycrystal layer 13 than in the polysilicon layer 14 and the lateral sidewall oxide film 15 has an increased thickness in the part covering the SiGe polycrystal layer 13 than in the polysilicon layer 14. For example, the lateral sidewall oxide film 15 may have a thickness of about 3 nm in the part covering the polysilicon layer 14 and a thickness of about 10 nm in the part covering the SiGe polycrystal layer 13.

Figure 3C:
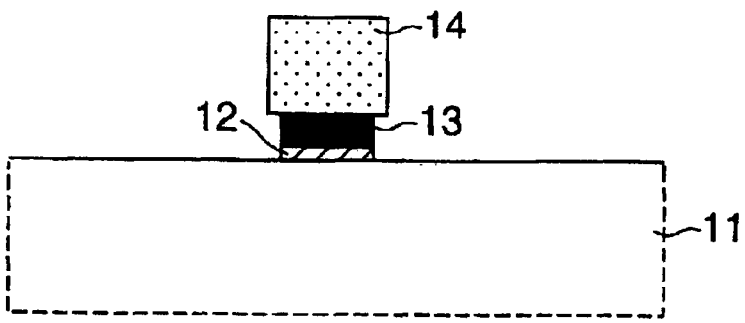

Next, in the step of FIG. 3C, the lateral sidewall oxide film 15 is removed by an aqueous solution of HF, and an ion implantation process of B is conducted into the substrate 11 as a punch-through stopper.

Figure 3D:
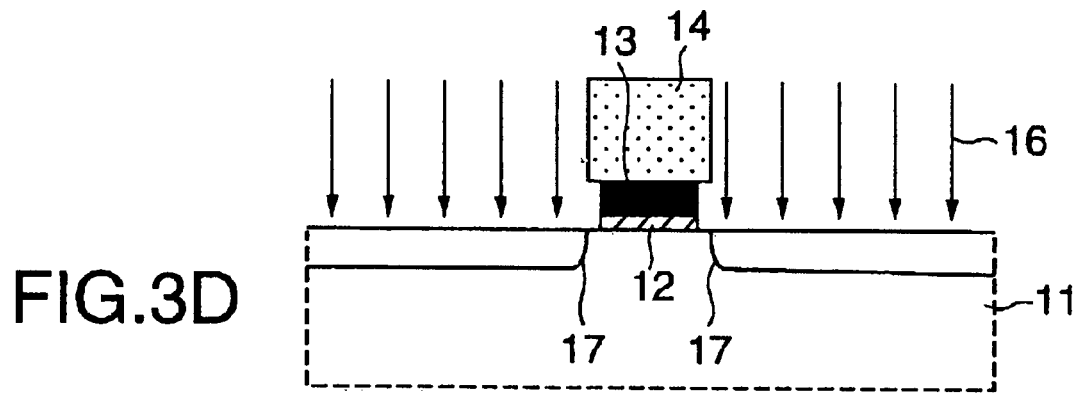

Next, in the step of FIG. 3D, an ion implantation process of $As^+$ ions 16 is conducted into the substrate 11 while using the polysilicon layer 14 of the T-shaped gate electrode as a mask, and there are formed a pair of n-type diffusion regions 17 at both lateral sides of the SiGe polycrystal layer constituting the bottom part of the T-shaped gate electrode with an offset therefrom.

Figure 3E:
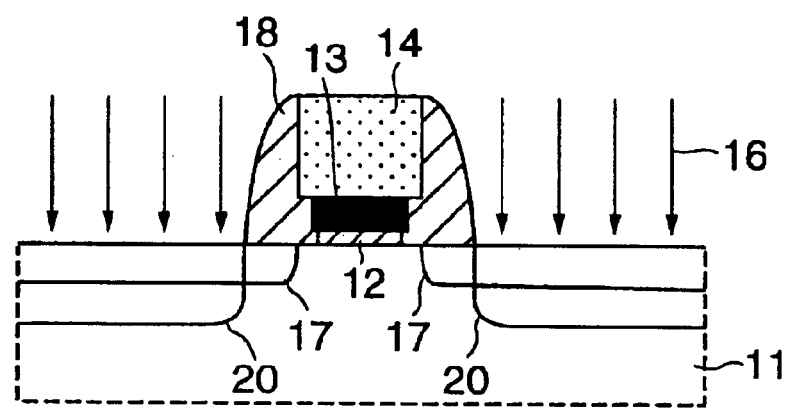

Next, in the step of FIG. 3E, the structure of FIG. 3D is covered by a CVD-$SiO_2$ film, followed by an etch-back process, and there are formed sidewall oxide films 18 at both lateral sides of the T-shaped gate electrode of FIG. 3D. Further, an ion implantation process of $As^+$ ions is conducted into the substrate 11 while using the sidewall oxide films 18 as a mask, and there are formed $n^+$-type diffusion regions 20 in the substrate 11 at the outer regions of the sidewall oxide films 18.

Figure 3F:
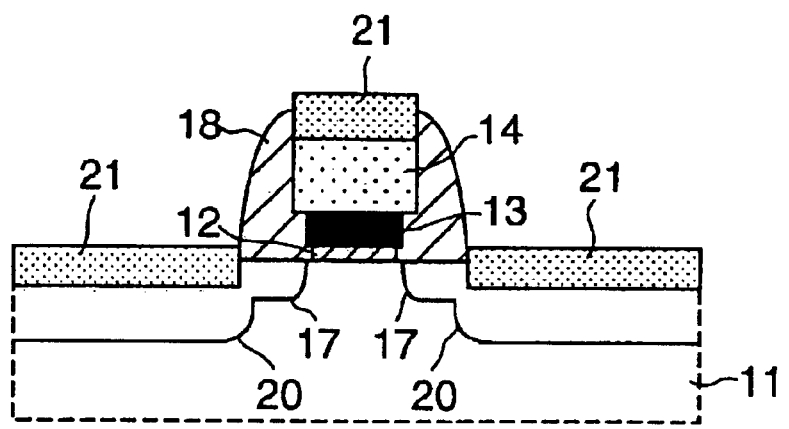

Next, in the step of FIG. 3F, the $As^+$ ions thus introduced are activated by applying a thermal annealing process. As a result of such a thermal annealing process, the respective tip ends of the n-type diffusion regions 17 approach with each other to reach the location more or less coincident to the lateral edges of the SiGe polycrystal layer 13, and the offset between the tip end of the diffusion region 17 and bottom lateral edge of the T-shaped gate electrode is eliminated. Thereby, the overlap of the diffusion region 17 and the bottom part of the T-shaped gate electrode is minimized.

Next, a Co layer (not shown) is deposited on the structure of FIG. 3E by a sputtering process with a thickness of 10 nm, followed by a rapid thermal annealing process conducted in an $N_2$ atmosphere at 550° C. for 30 minutes, and there are formed cobalt silicide regions 21 on the exposed surface of the $n^+$-type diffusion regions 20 and the top surface of the polysilicon layer 14 forming the T-shaped gate electrode.

After the formation of the cobalt silicide regions 21, the unreacted Co layer is removed by a wet etching process conducted for 20 minutes in an etchant containing $H_2SO_4$ and $H_2O_2$ with a ratio of 3:1, and the structure thus obtained is subjected to a rapid thermal annealing process conducted at 800° C. in an N2 atmosphere for 30 seconds, so as to convert the cobalt silicide layer 21 thus formed into a low-resistance silicide represented as $CoSi_2$.

As a result of such a process in the step of FIG. 3F, self-aligned ohmic electrodes are formed by the $CoSi_2$ layers 21 respectively on the $n^+$-type diffusion regions 20 and the polysilicon layer 14.

According to the present invention, the T-shaped gate electrode is formed easily and with high precision by employing the two-layer, polysilicon/SiGe structure for the gate electrode.

In view of the fact that the SiGe polycrystal layer 13 constituting the bottom part of the T-shaped gate electrode provides a higher activation rate of the impurity element, no depletion region is formed in the gate region in the vicinity of the interface to the gate insulation film, even when a gate voltage is applied to the gate electrode. Further, the T-shaped gate structure of the present invention allows the use of salicide structure on the top part of the T-shaped gate electrode.

By removing the lateral sidewall oxide film 15 in the step of FIG. 3C, the present embodiment enables a high-precision control when forming the punch-through stopper structure.

[Second Embodiment]

Figure 4A:
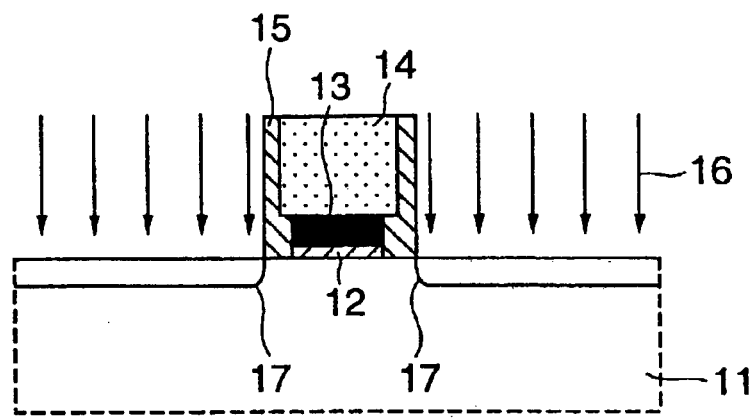
FIGS. 4A–4C are diagrams showing the fabrication process of a MOSFET according to a second embodiment of the present invention.
Figure 4B:
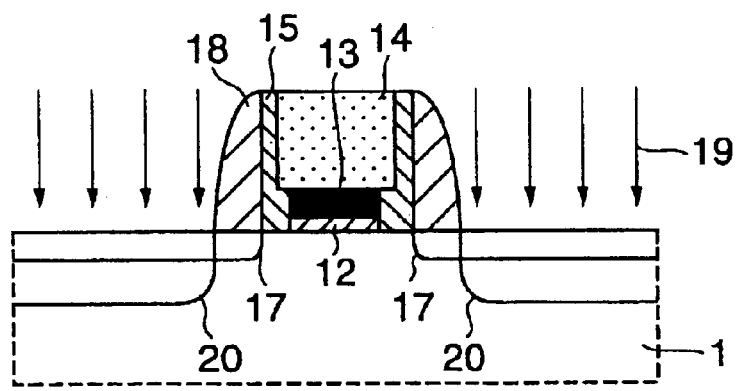
Figure 4C:
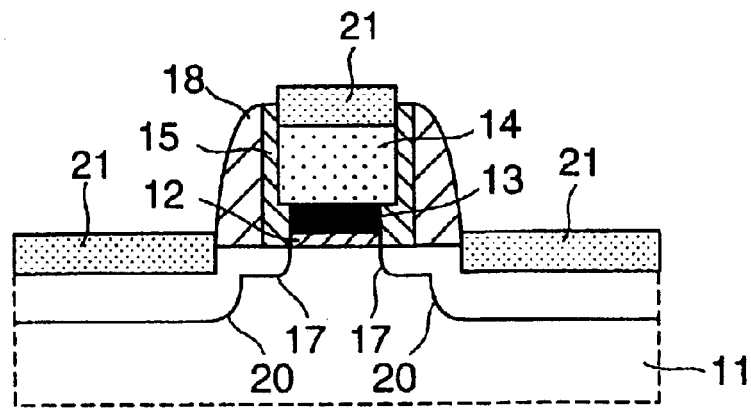

FIGS. 4A–4C show the fabrication process of a MOSFET according to a second embodiment of the present invention, wherein those parts corresponding to the parts described previously are designated by the same reference numerals and the description thereof will be omitted.

Referring to FIG. 4A, the structure corresponds to the structure of FIG. 3B of the previous embodiment, and the formation of the punch-stopper structure is conducted in the step of FIG. 4A by conducting an ion implantation process of B.

After the formation of the punch-through stopper structure, the diffusion regions 17 are formed in the substrate 11 by an ion implantation of $As^+$ ions 16 while using the lateral sidewall oxide film 15 as a self-aligned mask.

Next, in the step of FIG. 4B, the sidewall oxide films 18 are formed on the lateral sidewalls of the oxide films 15 by a CVD process and an etch-back process, and an ion implantation process of As+ ions 19 is conducted into the substrate 11 to form the n+-type diffusion regions 20 while using the sidewall oxide films 18 as a self-aligned mask.

Further, the $As^+$ ions introduced in the steps of FIGS. 4A and 4B are activated in the step of FIG. 4C by applying a thermal annealing process to the structure of FIG. 4B, wherein such a thermal annealing process causes a movement of the tip end of the diffusion regions 17 to the location more or less coincident with the bottom lateral edge of the T-shaped gate electrode as represented in FIG. 4C.

Further, the $CoSi_2$ ohmic electrodes 21 are formed on the $n^+$-type diffusion regions 20 and on the polysilicon layer 14, similarly to the previous embodiment.

According to the present embodiment, it is possible to reduce the number of fabrication steps by eliminating the step for removing the lateral sidewall oxide film 15.

[Third Embodiment]

Figure 5A:
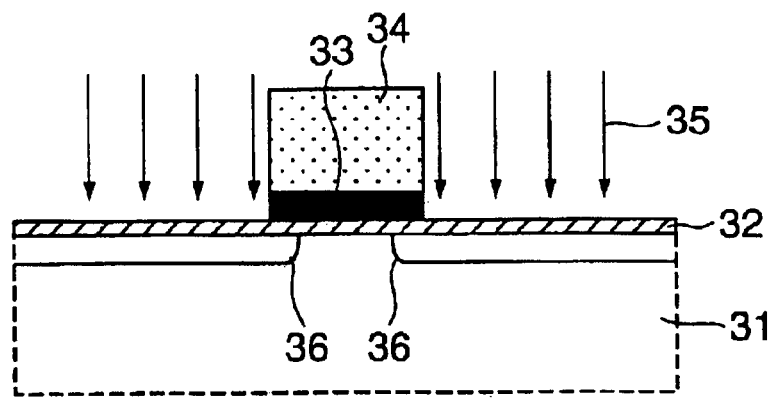
FIGS. 5A–5C are diagrams showing the fabrication process of a MOSFET according to a third embodiment of the present invention.
Figure 5B:
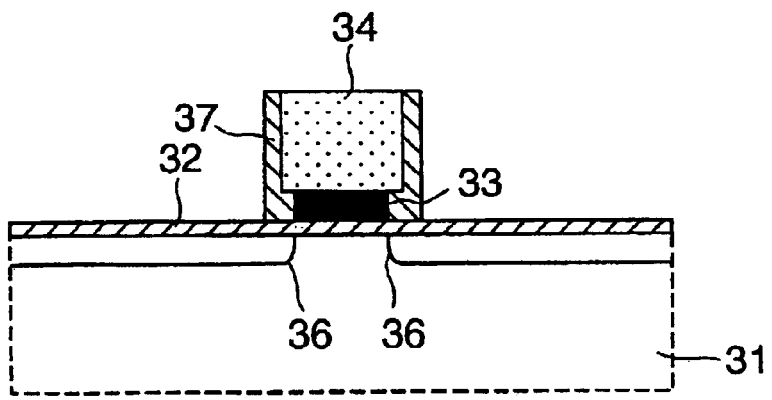
Figure 5C:
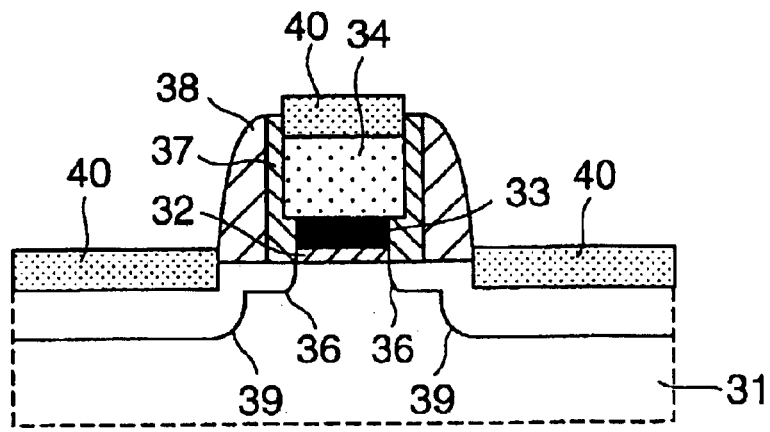

FIGS. 5A–5C show the fabrication process of a MOSFET according to a third embodiment of the present invention.

Referring to FIG. 5A, a gate oxide film 32 is formed on a p-type Si substrate 31 with a thickness of about 3 nm, and a polycrystal SiGe layer 33 is formed on the gate oxide film 32 with a thickness of about 50 nm, by a low-pressure CVD process, while using $SiH_4$ and $GeH_4$ as the source of Si and Ge. Further, a polysilicon layer 34 is deposited on the SiGe polycrystal layer 33 with a thickness of about 100 nm by a CVD process while using $SiH_4$ as the source of Si. The SiGe polycrystal layer 13 may have a composition of $Si_{90}Ge_{10}$.

Next, an anisotropic etching process is applied to the layers 13 and 14 thus formed such that there is formed a gate electrode structure having a gate length of 0.1 $\mu$m.

In the step of FIG. 5A, an ion implantation process of B is conducted selectively to the part of the substrate 31 adjacent to the lateral edge of the gate electrode 33 for forming the punch-through stopper structure, and an ion implantation process of $As^+$ ions 35 is conducted while using the polysilicon upper gate electrode 34 as a mask As a result of the ion implantation process of the As⁺ ions 35, n-type diffusion regions 36 are formed in the substrate 31 in alignment with the gate electrode on the gate insulation film 32.

Next, the structure of FIG. 5A is subjected to a dry oxidation process in the step of FIG. 5B, and there is formed a lateral sidewall oxide film 37 on the lateral sidewalls of the polysilicon layer 34 and the SiGe polycrystal layer 33. Because of the increased oxidation rate of the SiGe polycrystal layer 33, the lateral sidewall oxide film 37 has an increased thickness in the part covering the sidewall of the SiGe polycrystal layer 33 than the part covering the sidewall of the polysilicon layer 34. As a result, there is formed a T-shaped gate electrode as represented in FIG. 5B.

With the formation of the lateral sidewall oxide films 37, the respective tip ends of the n-type diffusion regions 36 approach with each other and to the location more or less coincident to the lateral edges of the SiGe polycrystal layer 33 as represented in FIG. 5B.

Next, in the step of FIG. 5C, a pair of sidewall oxide films 38 are provided on the structure of FIG. 5B by depositing a CVD-$SiO_2$ film and applying an etch-back process thereto. Further, an ion implantation process of As⁺ is conducted into the substrate 31 while using the sidewall oxide films 38 as a mask. As a result, n⁺-type diffusion regions 39 are formed in the substrate 31 at the region outward to the n-type diffusion regions 36.

Further, $CoSi_2$ ohmic electrodes 40 are formed on the exposed surface of the n⁺-type diffusion regions 39 and on the polysilicon layer 34 of the T-shaped gate electrode.

According to the present embodiment, it is possible to conduct the annealing process for forming the n⁺-type diffusion regions 39 and the $CoSi_2$ ohmic electrodes 40 simultaneously.

[Fourth Embodiment]

Figure 6:
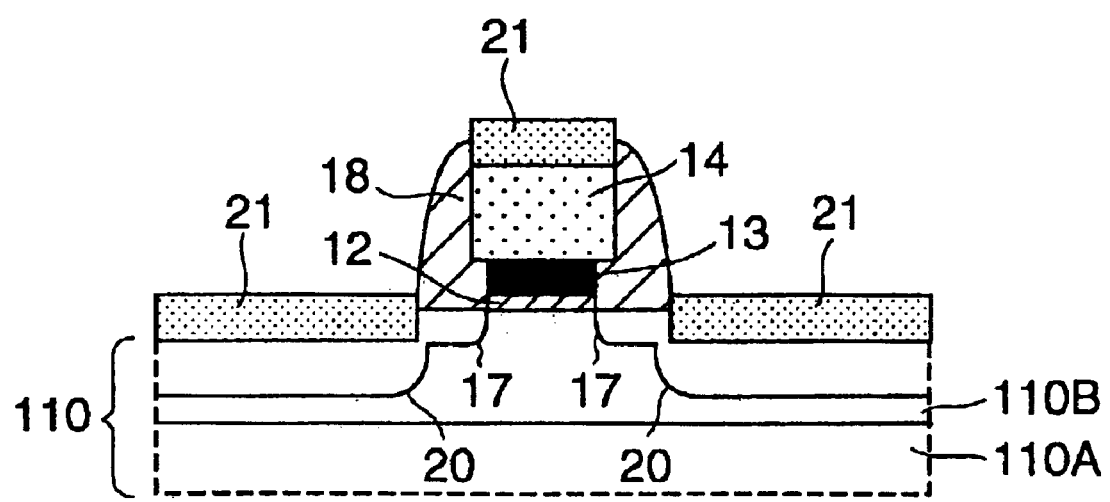
FIG. 6 is a diagram showing the construction of a MOSFET according to a fourth embodiment of the present invention.

FIG. 6 shows the construction of a MOSFET according to a fourth embodiment of the present invention, wherein those parts corresponding to the parts described previously are designated by the same reference numerals and the description thereof will be omitted.

Referring to FIG. 6, the MOSFET of the present embodiment uses a substrate 110 having an SOI (silicon-on-insulator) structure.

Thus, the substrate 110 includes an oxide substrate 110A and a p-type Si layer 110B formed thereon, and the MOSFET is formed on such a p-type Si layer 110B.

According to the present embodiment, it becomes possible to minimize the junction capacitance for the diffusion regions 20, and the operational speed of the MOSFET is improved further.

In the description heretofore, it should be noted that the SiGe polycrystal layer 13 or 33 may be formed by an ion implantation of Ge into a polysilicon layer. Further, the SiGe polycrystal layer 13 or 33 may further contain C. Particularly, the SiGe polycrystal layer containing C with 1.5 at % is effective for blocking the penetration of B.

Further, the SiGe polycrystal layer 13 or 33 may contain additional elements such as B, P or As for electric conductivity.

The oxidation process used in the step of FIG. 3B is not limited to a dry oxidation process but a wet oxidation process may be used also.

Further, the SiN mask layer explained with reference to the step of FIG. 3B for avoiding the oxidation of the top surface of the polysilicon layer 14 may be eliminated in the first embodiment, as any oxide film formed on the top surface of the polysilicon layer 14 is removed during the etching process of FIG. 3C.

The present invention is effective not only for the N-channel MOS transistors explained heretofore, but also for P-channel MOS transistors that uses a B-doping for the gate electrode for constructing a CMOS circuit operating at low voltages.

Further, the present invention is not limited to the embodiments described heretofore, but various variations and modifications may be made without departing from the scope of the invention.

What is claimed is:

1. A method of fabricating a semiconductor device, comprising the steps of:

forming a gate insulation film on a substrate, said substrate including a semiconductor layer at least on a top part thereof;

depositing a first polycrystal layer containing at least Si and Ge on said semiconductor layer;

depositing a second polycrystal layer of Si on said first polycrystal layer;

patterning said first and second polycrystal layers to form a gate electrode defined by a pair of sidewalls; and applying an oxidation process to said first and second polycrystal layers such that said first and second polycrystal layers undergo oxidation at said both sidewalls.

2. A method as claimed in claim 1, further comprising the step of removing an oxide film formed in said step of applying said oxidation process.

3. A method as claimed in claim 1, wherein said first polycrystal layer is formed by a CVD process while using $SiH_4$ and $GeH_4$ as respective sources.

4. A method as claimed in claim 1, wherein said first polycrystal layer is formed by conducting an ion implantation process of Ge into a polysilicon layer.

* * * * *